United States Patent
Osada et al.

(10) Patent No.: US 9,224,584 B2
(45) Date of Patent: Dec. 29, 2015

(54) SPUTTERING TARGET ASSEMBLY

(71) Applicant: JX Nippon Mining & Metals Corporation, Tokyo (JP)

(72) Inventors: Kozo Osada, Ibaraki (JP); Toshiya Kurihara, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/375,239

(22) PCT Filed: Sep. 25, 2012

(86) PCT No.: PCT/JP2012/074460
§ 371 (c)(1),
(2) Date: Jul. 29, 2014

(87) PCT Pub. No.: WO2013/114666
PCT Pub. Date: Aug. 8, 2013

(65) Prior Publication Data
US 2014/0367252 A1  Dec. 18, 2014

(30) Foreign Application Priority Data

Jan. 31, 2012 (JP) ................................ 2012-018089

(51) Int. Cl.
*C23C 14/24* (2006.01)
*H01J 37/34* (2006.01)
*C23C 14/34* (2006.01)

(52) U.S. Cl.
CPC .......... *H01J 37/3423* (2013.01); *C23C 14/3407* (2013.01); *H01J 37/342* (2013.01); *H01J 37/3417* (2013.01); *H01J 37/3435* (2013.01)

(58) Field of Classification Search
CPC ............................ H01J 37/342; H01J 37/3429
See application file for complete search history.

(56) References Cited

U.S. PATENT DOCUMENTS

| | | | |
|---|---|---|---|
| 4,443,318 A | 4/1984 | McKelvey | |
| 8,349,156 B2 | 1/2013 | Stowell et al. | |
| 2002/0096430 A1* | 7/2002 | Lupton et al. | ............ 204/298.12 |
| 2006/0006064 A1 | 1/2006 | Tepman | |

(Continued)

FOREIGN PATENT DOCUMENTS

| | | |
|---|---|---|
| JP | H05-017867 A | 1/1993 |
| JP | H05-263234 A | 10/1993 |
| JP | 2000-328241 A | 11/2000 |
| JP | 2007-119824 A | 5/2007 |
| JP | 2008-038250 A | 2/2008 |

(Continued)

*Primary Examiner* — Jason M Berman
(74) *Attorney, Agent, or Firm* — Howson & Howson LLP

(57) ABSTRACT

Provided is a sputtering target assembly comprising two or more sputtering target-backing plate bonded bodies B aligned in the width direction, wherein the sputtering target-backing plate bonded bodies B each include a cylindrical target having a diameter of 100 mm or more and a length of 1000 mm or more and composed of three or more target pieces A being divided such that the dividing lines lie in the circumferential direction and being bonded or placed onto a cylindrical or columnar backing plate, wherein the bonded bodies B are arranged to form the sputtering target assembly in such a manner that the dividing lines between the three target pieces of one bonded body B are not present at the same positions of the dividing lines between fractional target pieces of adjacent another bonded body B. It is an object of the present invention to provide a sputtering target assembly that can reduce defects due to occurrence of particles originated from the piece-bonding area.

12 Claims, 3 Drawing Sheets

(56) References Cited

U.S. PATENT DOCUMENTS

2009/0283400 A1 11/2009 Stowell et al.
2011/0031117 A1* 2/2011 Kim et al. ............ 204/298.13

FOREIGN PATENT DOCUMENTS

| | | |
|---|---|---|
| JP | 2008-184640 A | 8/2008 |
| WO | 2012/108075 A1 | 8/2012 |

* cited by examiner

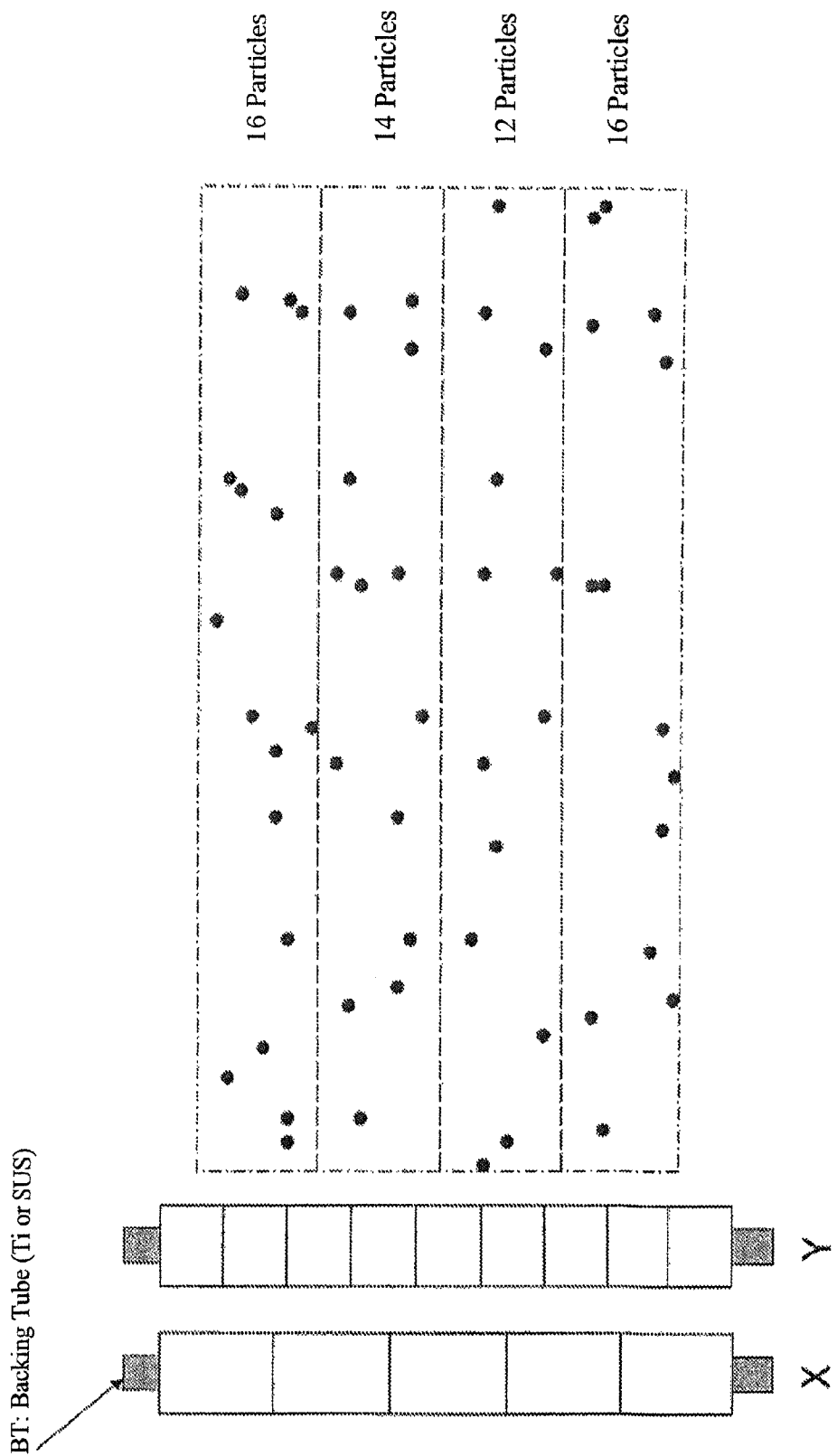
[FIG. 1]

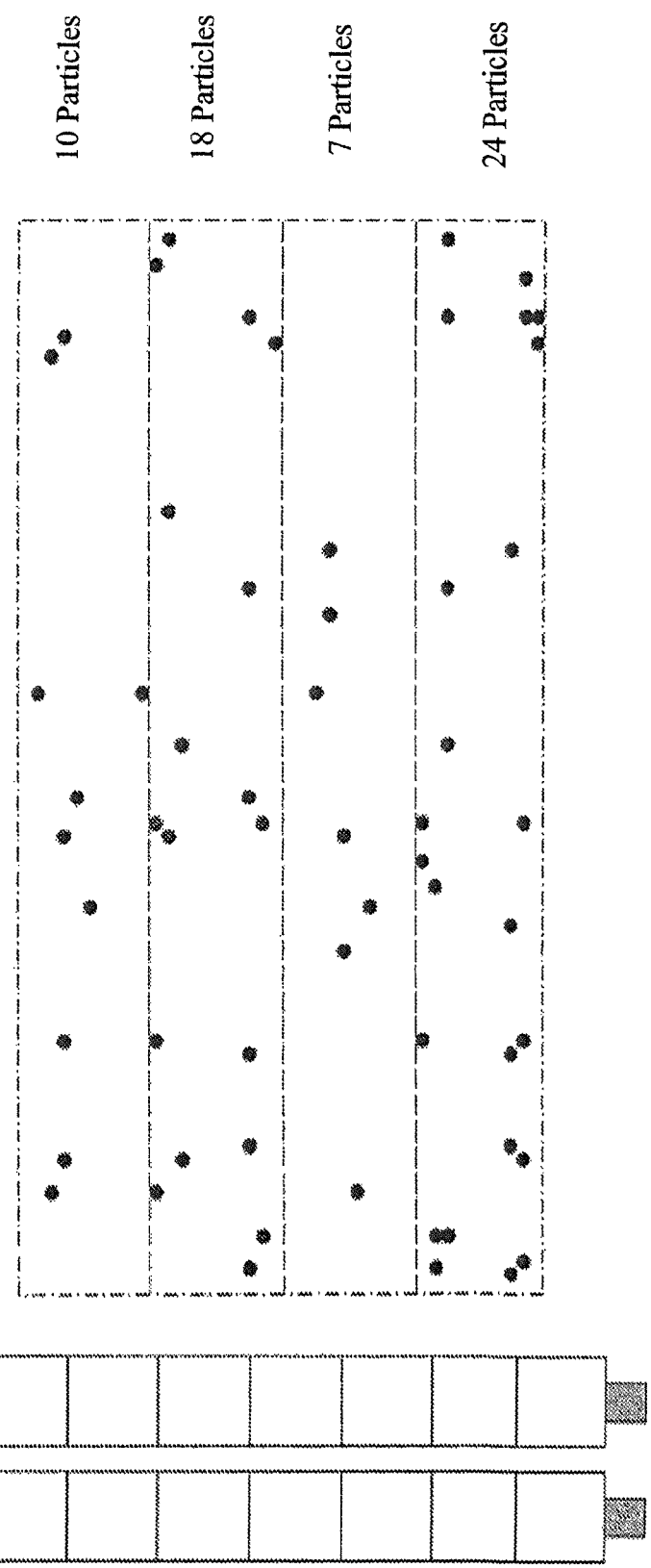

[FIG. 4]
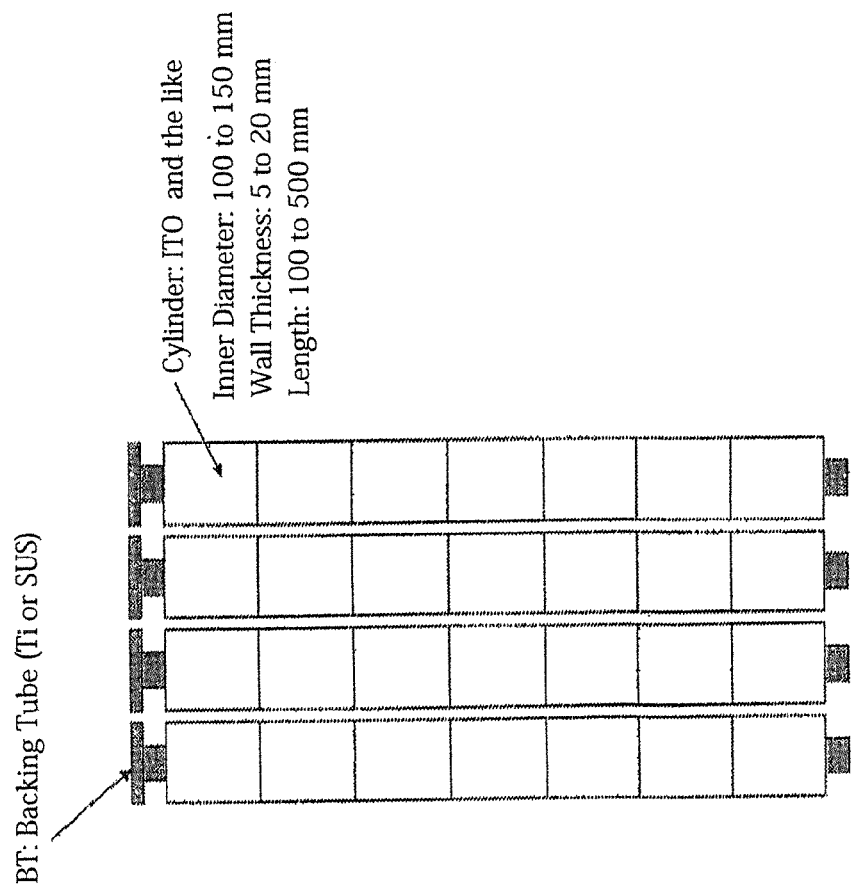
Cylinder: ITO and the like
Inner Diameter: 100 to 150 mm
Wall Thickness: 5 to 20 mm
Length: 100 to 500 mm
BT: Backing Tube (Ti or SUS)
[FIG. 3]
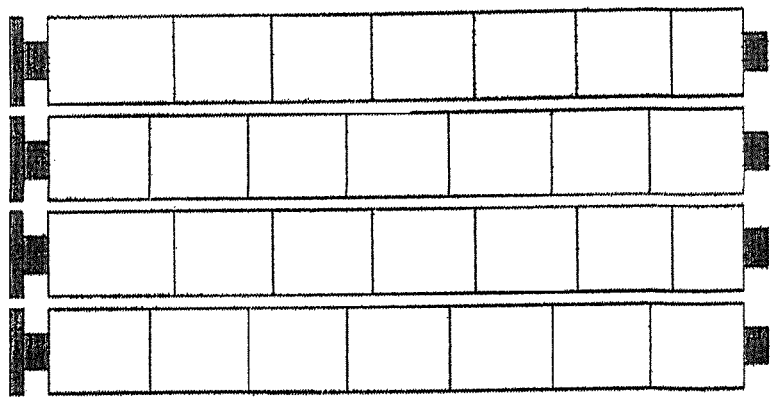

SPUTTERING TARGET ASSEMBLY

FIELD

The present invention relates to a sputtering target assembly, in particular, a sputtering target assembly for FPD, in a cylindrical form for reducing defects due to occurrence of particles originated from the piece-bonding area.

BACKGROUND

Thin film for forming transparent conductive films, such as indium tin oxide (ITO), ZnO-based, $In_2O_3$—ZnO-based, and MgO-based thin films, have been widely used as transparent electrodes of display devices mainly, for example, liquid crystal displays, touch panels, and EL displays. In many cases, oxide thin films, such as ITO thin films, for forming transparent conductive films are formed by sputtering.

In recent years, transparent conductive films for large-size flat panel displays (FPDs) are usually formed with in-line sputtering apparatuses. In the eighth and subsequent generations, from several to ten and several target plates each having a width of 150 to 300 mm and a length of 1500 mm or more are arranged, and a film is formed by moving a large-size glass substrate in the front of the targets.

It is difficult to produce such a large target as a single target plate. In general, several target pieces aligned in the longitudinal direction are bonded on a backing plate to form a single target-backing plate bonded body, and several bonded bodies are further aligned in the width direction into a large size.

A large target can be produced by arranging the target-backing plate bonded bodies in the width direction, however, the dividing lines in the several target pieces arranged in the longitudinal direction form lines with the corresponding dividing lines between target pieces of the adjacent target-backing plate bonded body. The dividing line involves a gap between the target pieces, and the target pieces differ from each other in the height though height difference is slight. Hence, a difference in level is generated with the dividing line as the boundary, and nodules are easily generated from the dividing line during sputtering. This causes adhesion of a large amount of dust, called particles, in a stripe shape on the film, resulting in a reduction in yield.

In general, from the easiness of production, target pieces having the same sizes are produced and are bonded onto a backing plate. In this case, the target pieces are finely aligned to give an apparently good appearance, however, all of dividing lines between adjoining target pieces are aligned and nodules are thereby concentrated at the area of aligned target pieces, which causes concentration of adhesion of dust called particles, at specific positions on the film, resulting in a reduction in yield.

The above-mentioned problem has been overlooked for a long time without becoming obvious, since the enhancement of productivity of target itself has been focused on and the production volume of large-size FPDs has been low in the past. In recent years, however, the defects in film formation have increased with an increase in production volume of large-size FPDs, and cases leading to a decrease in productivity have actually occurred.

In conventional technologies, Patent Literature 1 describes a large rectangular target plate that is a target assembly configured of a large number of tiles each meeting at interstices of three tiles or less, wherein the tiles are prevented from misalignment during thermal cycling. In this case, the tiles may be rectangular, square, hexagonal, or fan-shaped.

In Patent Literature 1, a large number of tiles are densely arranged for avoiding misalignment of the tiles, and no measures for preventing occurrence of nodules during sputtering and particles on a film are employed. In all FIGS. 6 to 10 showing examples of the target assemblies of Patent Literature 1, joining part of tiles are aligned at least between every other tile. Such a target assembly consequently causes occurrence of nodules during sputtering or increase of particles on a film.

Patent Literature 2 describes a disk-shaped divided-target composed of a circular fractional piece at the center and four fan-shaped fractional pieces at the periphery, which lack the central portion. It is proposed to join these fractional pieces by providing a difference in level at the joining part. Such a disk-shaped divided-target is unsuitable for producing a target assembly for large-size flat panel displays (FPDs).

In the divided-target of Patent Literature 2, the joining part of tiles are aligned between every other tile. The target having such a structure consequently has a problem of causing occurrence of nodules during sputtering or increase of particles on a film.

Patent Literature 3 describes a disk-shaped divided-target composed of a circular fractional piece at the center and two fan-shaped fractional pieces at the periphery, which lack the central portion. It is proposed to obliquely join these fractional pieces by providing a cut to each fractional piece at the joining part. However, such a disk-shaped divided-target as with the invention of Patent Literature 2 is unsuitable for producing a target assembly for large-size flat panel displays (FPDs).

In the divided-target of Patent Literature 3, the joining parts of tiles are aligned between every other tile. The target having such a structure consequently has a problem of causing occurrence of nodules during sputtering or increase of particles on a film.

These Patent Literatures are the same in that the targets are divided-targets each configured by arranging pieces on a single backing plate and do not arrive at the solution of the problem caused by an increase in size by arranging the target-backing plate bonded bodies in the width direction. Also it is problematic that no measures are employed to reduce the causes of occurrence of nodules during sputtering and increase of particles on a film.

Under such circumstances, the present inventors have filed a patent application for a sputtering target assembly (see Patent Literature 4), wherein a rectangular target plate having a width of 100 mm or more and a length of 1000 mm or more is composed of three or more target pieces A; a sputtering target-backing plate bonded body B is constituted by bonding the fractional target pieces A in the longitudinal direction on a backing plate such that the dividing lines lie in the width direction; and three or more of the sputtering target-backing plate bonded bodies B are further aligned in the width direction. The bonded bodies B are arranged into a sputtering target assembly in such a manner that the dividing lines between the three target pieces of one bonded body B are not present at the same positions of the dividing lines between fractional target pieces of adjacent another bonded body B.

This provides a significant effect of reducing defects due to occurrence of particles originated from target piece-bonding area. However, the structure of this sputtering target-backing plate bonded body needs a large width, which is a bit of a problem.

CITATION LIST

Patent Literature

Patent Literature 1: Japanese Patent Laid-Open No. 2006-22404

Patent Literature 2: Japanese Patent Laid-Open No. H05-263234

Patent Literature 3: Japanese Patent Laid-Open No. H05-17867

Patent Literature 4: International Publication No. WO 2012/108075 A1

SUMMARY OF THE INVENTION

The present invention provides a large-size sputtering target-backing tube bonded body, in particular, a sputtering target assembly for FPD that can reduce defects due to occurrence of particles originated from target piece-bonding area. It is an object of the invention to reduce the size of the structure of the sputtering target-backing tube bonded body as well as to increase the efficiency.

In order to solve the above-mentioned problems, the present inventors have diligently studied and, as a result, have found that an assembly, in particular, a sputtering target assembly for FPD, composed of cylindrical sputtering target-backing tube bonded bodies that can reduce defects due to occurrence of particles originated from the piece-bonding area can be provided by producing the sputtering target-backing tube bonded bodies by attaching a sputtering target composed of a plurality of cylindrical pieces to a columnar or cylindrical backing tube, in which the shape and the arrangement of the pieces are devised.

The present invention based on these findings provides: 1) A sputtering target assembly comprising: two or more sputtering target-backing tube bonded bodies B aligned in the width direction; characterized in that the sputtering target-backing tube bonded bodies B each include a cylindrical target; a cylindrical target having a diameter of 100 mm or more and a length of 1000 mm or more; and composed of three or more target pieces A being divided such that the dividing lines lie in the circumferential direction and being bonded or placed onto a cylindrical or columnar backing tube, wherein the bonded bodies B are arranged to form the sputtering target assembly in such a manner that the dividing lines between the three target pieces of one bonded body B are not present at the same positions of the dividing lines between fractional target pieces of adjacent another bonded body B.

The invention also provides: 2) The sputtering target assembly according to aspect 1), wherein each fractional target piece A in a single sputtering target-backing tube bonded body B has a length different from each other by 20 mm or more.

The invention also provides: 3) The sputtering target assembly according to aspect 1), wherein each fractional target piece A in a single sputtering target-backing tube bonded body B has a length different from each other by 50 mm or more.

The invention also provides: 4) The sputtering target assembly according to aspect 1), wherein each fractional target piece A in a single sputtering target-backing tube bonded body B has a length different from each other by 100 mm or more.

The invention also provides: 5) The sputtering target assembly according to any one of aspects 1) to 4), wherein a dividing line between the target pieces of one sputtering target-backing tube bonded body B and a dividing line between the target pieces of adjacent another sputtering target-backing tube bonded body B are parallel to each other with a parallel distance of 20 mm or more between the adjacent dividing lines.

The invention also provides: 6) The sputtering target assembly according to any one of aspects 1) to 4), wherein a dividing line between the target pieces of one sputtering target-backing tube bonded body B and a dividing line between the target pieces of adjacent another sputtering target-backing tube bonded body B are parallel to each other with a parallel distance of 50 mm or more between the adjacent dividing lines.

The invention also provides: 7) The sputtering target assembly according to any one of aspects 1) to 4), wherein a dividing line between the target pieces of one sputtering target-backing tube bonded body B and a dividing line between the target pieces of adjacent another sputtering target-backing tube bonded body B are parallel to each other with a parallel distance of 100 mm or more between the adjacent dividing lines.

The invention further provides: 8) The sputtering target assembly according to any one of aspects 1) to 7), wherein the three or more cylindrical target pieces A in one sputtering target-backing tube bonded body B have the same size as that of three or more cylindrical target pieces A of another sputtering target-backing tube bonded body B.

The sputtering target of the present invention prepared above can provide a sputtering target assembly, in particular, sputtering target assembly for FPD, composed of sputtering target-backing tube bonded bodies. The sputtering target-backing tube bonded bodies are each produced by bonding or placing the sputtering target composed of a plurality of cylindrical sputtering target pieces onto a cylindrical or columnar backing tube, wherein the shapes and the arrangement of the target pieces are devised so as to reduce defects due to occurrence of particles originated from the target piece-bonding area, leading to significant advantages of increasing the yield in film formation and of improving the quality of products.

BRIEF DESCRIPTION OF THE DRAWINGS

FIG. 1 shows the state of occurrence of particles when a film was formed using a sputtering target assembly composed of sputtering target-backing tube bonded bodies of Example 1.

FIG. 2 shows the state of occurrence of particles when a film was formed using a sputtering target assembly composed of sputtering target-backing tube bonded bodies of Comparative Example 1.

FIG. 3 shows an example of the sputtering target assembly composed of four sputtering target-backing tube bonded bodies of Example 2, wherein the bonded bodies having the same structure are alternately arranged.

FIG. 4 shows an example of the sputtering target assembly composed of four sputtering target-backing tube bonded bodies of Comparative Example 2, wherein all the bonded bodies have the same structure.

DETAILED DESCRIPTION

In the sputtering target assembly of the present invention, a cylindrical target has a diameter of 100 mm or more and a length of 1000 mm or more and is composed of three or more target pieces A being divided such that the dividing lines lie in the circumferential direction, and the fractional target pieces A are bonded or placed on a cylindrical or columnar backing tube to construct a sputtering target-backing tube bonded body 8. The cylindrical or columnar backing tube is usually made of titanium or stainless steel (SUS) having high strength, but the material is not particularly limited.

The sputtering target assembly is formed by further aligning two or more of the bonded bodies 8. The bonded bodies 8 are arranged to form the sputtering target assembly in such a manner that the dividing lines between the three target pieces of one bonded body 8 are not present (are not aligned) at the same positions of the dividing lines between fractional target pieces of adjacent another bonded body 8. The target assembly is characteristic in the arrangement structure of the targets (target pieces).

Sputtering film formation was performed by rotating the sputtering target assembly composed of two or more bonded bodies 8 aligned and transporting a rectangular substrate to be coated near the sputtering target assembly while the assembly and the substrate are maintained to be parallel to each other with a certain distance therebetween. When the substrate is a film, a film can also be formed on the substrate (film) in a roll form. The speed of rotation of the sputtering target assembly and the rate of transporting the substrate are usually the same as each other, but these speeds may be different from each other. The sputtering target assembly is worn with the progress of film formation. In such a case, the deposition rate can be maintained constant by increasing the speed of rotation of the sputtering target assembly.

A film is usually formed by vertically (perpendicularly) disposing a columnar sputtering target assembly and also vertically moving a substrate. A film can also be formed by horizontally disposing a columnar sputtering target assembly and similarly horizontally moving a substrate. Alternatively, a film can be formed by tilting the both. The arrangement form is arbitrary.

The sputtering target assembly described above is suitable as a sputtering target for FPD and can reduce occurrence particles to increase the yield and has a function equivalent to that of a tabular large-size sputtering target assembly. A prominent feature of the sputtering target assembly of the present invention is that the size can be reduced.

FIG. 1 shows a typical sputtering target assembly in which a target bonded body X composed of five target pieces having the same lengths attached to a cylindrical backing tube and a target bonded body Y composed of nine target pieces having the same lengths attached to a cylindrical backing tube are aligned.

A dividing line is present in the circumferential direction between adjoining target pieces. The dividing line is a gap formed because the target pieces are individually produced. In the present invention, as described above, the target pieces in different target-backing tube bonded bodies have different lengths so that the dividing lines between the target pieces of one target-backing tube bonded body are shifted from those of the other target-backing tube bonded body when the bonded bodies are aligned. As a result, the particles originated from the dividing line area are dispersed to increase the yield.

In the sputtering apparatus of the present invention, the fractional target pieces A in a single sputtering target-backing tube bonded body 8 can have a difference in length of 20 mm or more, or 50 mm or more, or 100 mm or more. The sputtering target assembly of the present invention can achieve such a configuration. This aims for a combination of the target pieces having different sizes depending on the material of the target. The sputtering target assembly may have any size; however, the diameter is usually 100 to 200 mm because a cooling mechanism and a magnet for controlling the magnetic field during sputtering will be disposed inside the target pieces. The length is varied depending on the size of a substrate as an object of film formation. The length of about 1000 to 3000 mm is usually used.

In the sputtering target assembly of the present invention, the dividing lines between the target pieces of one sputtering target-backing tube bonded body 8 and the dividing lines between the target pieces of adjacent another sputtering target-backing tube bonded body 8 are desirably parallel to each other with a parallel distance of 20 mm or more, or 50 mm or more, or 100 mm or more between the adjacent joining positions. This aims for combining the sputtering target-backing tube bonded bodies B so as to shift the joining positions of the target pieces as far as possible without forming a line of the joining positions.

In the present invention, a single sputtering target-backing tube bonded body can be configured from three or more cylindrical target pieces A having the same sizes. From a viewpoint of productivity of targets, the target pieces A desirably have the same shapes. Production of target pieces having different shapes causes an increase in manufacturing cost. The target pieces A of the present invention are all cylindrical and therefore have an advantage of not causing complication and an increase in manufacturing cost, unlike the inventions of the above-mentioned Patent Literatures.

The present invention has an advantage that only two types of cylindrical target pieces A allow the dividing lines not to overlap each other (not to lie on the same line) between adjacent sputtering target-backing tube bonded bodies X and Y. As described in examples below, two types of cylindrical target pieces A1 and A2 having different sizes may be produced as the target pieces A and may be disposed on respective cylindrical or columnar backing tubes. The sputtering target-backing tube bonded bodies X and Y, are alternately arrayed.

In these combinations, the dividing lines between each target pieces are not aligned due to the positional relationship of the adjacent sputtering target-backing tube bonded bodies. This means that the minimum kinds of target pieces having the same shapes for realizing the present invention is two, which can reduce the manufacturing cost. Three or more types of cylindrical target pieces having different sizes such that the dividing lines are not aligned may be produced and arranged as the cylindrical target pieces A. The arrangement form is arbitrary.

EXAMPLES

The present invention will now be described by examples and comparative examples. The examples are merely exemplary and are not intended to limit the scope of the invention. That is, the present invention is limited only by the claims and encompasses various modifications in addition to examples included in the present invention.

Example 1

Two types of sputtering target-backing tube bonded bodies X and Y, were each produced by joining a cylindrical target having an inner diameter of 135 mm, an outer diameter of 153 mm, and a length of 1364 mm to a cylindrical backing tube (denoted as a backing tube in FIG. 1) as shown in FIG. 1 by bonding five fractional pieces (each having a length of 272 mm) and nine fractional pieces (each having a length of 151 mm).

As shown in the left of FIG. 1, when these bonded bodies are juxtaposed, the dividing lines between target pieces shift from each other. These two types of the sputtering target-backing tube bonded bodies X and Y, were set to prepare a sputtering target assembly.

A film was formed using the sputtering target assembly on a film by a roll-to-roll method and was cut into a strip of 1200×3000 mm, followed by counting of the number of particles. The film substrate was equally divided into four regions, and the number of particles in each region was counted.

As a result, as shown in the right of FIG. 1, the numbers of particles were all within a range of 12 to 16. Thus, the film was sufficient as a product.

Comparative Example 1

Two sputtering target-backing tube bonded bodies having the same shape were each produced by joining a cylindrical target having an inner diameter of 135 mm, an outer diameter of 153 mm, and a length of 1364 mm to a cylindrical backing tube (denoted as a backing tube in FIG. 2) as shown in FIG. 2 by bonding seven fractional pieces (each having a length of 194 mm).

As shown in the left of FIG. 2, when these bonded bodies are juxtaposed, the dividing lines between target pieces lie on the same line. These two sputtering target-backing tube bonded bodies were set to prepare a sputtering target assembly. A film was formed using the sputtering target assembly on a film by a roll-to-roll method and was cut into a strip of 1200×3000 mm, followed by counting of the number of particles. The film substrate was equally divided into four regions, and the number of particles in each region was counted. As a result, as shown in the right of FIG. 2, the numbers of particles varied in 7, 10, 18, and 24. The region having a small number of particles was acceptable, but the film disadvantageously had a region having a large number of particles. Accordingly, the film was insufficient as a product.

Example 2

FIG. 3 shows examples of sputtering target-backing tube bonded bodies each prepared by putting seven fractional target pieces constituting an ITO cylindrical target having an inner diameter of 100 to 135 mm, a wall thickness of 5 to 20 mm, and a length of 100 to 500 mm around a cylindrical backing tube. In this case, two groups of sputtering target-backing tube bonded bodies were prepared such that the dividing lines (bonding area) in the circumferential direction between adjoining target pieces in one group were shifted within a range of 20 to 50 mm from those in another group of sputtering target-backing tube bonded bodies. The sputtering target-backing tube bonded bodies having the same structure were arranged every other one. In this example also, the occurrence of particles was similar to that in Example 1.

Comparative Example 2

FIG. 4 shows examples of sputtering target-backing tube bonded bodies each prepared by putting seven fractional target pieces constituting an ITO cylindrical target having an inner diameter of 100 to 135 mm, a wall thickness of 5 to 20 mm, and a length of 100 to 500 mm around a cylindrical backing tube. In this case, sputtering target-backing tube bonded bodies were prepared such that the dividing lines (bonding area) in the circumferential direction between adjoining target pieces in different sputtering target-backing tube bonded bodies lie on the same lines. In this example, the occurrence of particles was similar to that in Comparative Example 1.

As obvious from Examples and Comparative Examples described above, it is significantly important to disperse particles originated from the dividing line in the circumferential direction of each target piece by varying the lengths of the pieces constituting a cylindrical sputtering target and arranging the targets on respective backing tubes such that the dividing lines between target pieces of one target are shifted from those of another target. As a result, a significant advantage of increasing the yield of a product is provided. The number of sputtering target-backing tube bonded bodies can be determined as long as the dividing lines between adjoining target pieces do not lie on the same line when the targets are arranged.

The sputtering target assembly including a large-size sputtering target-backing tube of the present invention has an excellent effect of reducing the rate of defects due to occurrence of particles originated from dividing lines between target pieces by bonding a sputtering target composed of a plurality of cylindrical pieces A onto each backing tube to construct bonded bodies B, in which the shapes and the arrangement of the pieces are devised. The assembly is useful as a sputtering target assembly for an in-line sputtering apparatus, in particular, producing a large-size FPD.

The invention claimed is:

1. A sputtering target assembly comprising two or more bonded bodies, each of the bonded bodies comprising a hollow cylindrical sputtering target surrounding and being bonded or placed onto an outer surface of a backing tube, and the bonded bodies being aligned parallel to each other with a space therebetween, wherein each of the cylindrical sputtering targets has an outer diameter of 100 mm or more and a length of 1000 mm or more and is composed of three or more separate target pieces stacked together without a gap therebetween and with only dividing lines appearing therebetween in a circumferential direction about the cylindrical sputtering target, and wherein the bonded bodies and the target pieces are made or arranged to form the sputtering target assembly in such a manner that any two of the dividing lines of adjacent bonded bodies are not aligned together to form a straight line.

2. The sputtering target assembly according to claim 1, wherein at least one of the bonded bodies includes one or more target pieces having a difference in length relative to the other target pieces of the same bonded body, the difference in length being 20 mm or more.

3. The sputtering target assembly according to claim 1, wherein at least one of the bonded bodies includes one or more target pieces having a difference in length relative to the other target pieces of the same bonded body, the difference in length being 50 mm or more.

4. The sputtering target assembly according to claim 1, wherein at least one of the bonded bodies includes one or more target pieces having a difference in length relative to the other target pieces of the same bonded body, the difference in length being 100 mm or more.

5. The sputtering target assembly according to claim 4, wherein the dividing lines of one of the bonded bodies are parallel to the dividing lines of an adjacent one of the bonded bodies, and wherein the dividing lines of said one of the bonded bodies and the dividing lines of said adjacent one of the bonded bodies are spaced apart in a direction perpendicular to the parallel dividing lines by a distance of 20 mm or more.

6. The sputtering target assembly according to claim 4, wherein the dividing lines of one of the bonded bodies are parallel to the dividing lines of an adjacent one of the bonded bodies, and wherein the dividing lines of said one of the bonded bodies and the dividing lines of said adjacent one of the bonded bodies are spaced apart in a direction perpendicular to the parallel dividing lines by a distance of 50 mm or more.

7. The sputtering target assembly according to claim 4, wherein the dividing lines of one of the bonded bodies are parallel to the dividing lines of an adjacent one of the bonded bodies, and wherein the dividing lines of said one of the bonded bodies and the dividing lines of said adjacent one of the bonded bodies are spaced apart in a direction perpendicular to the parallel dividing lines by a distance of 100 mm or more.

8. The sputtering target assembly according to claim 7, wherein all of the target pieces of one of the bonded bodies are of the same length.

9. The sputtering target assembly according to claim 1, wherein the dividing lines of one of the bonded bodies are parallel to the dividing lines of an adjacent one of the bonded bodies, and wherein the dividing lines of said one of the bonded bodies and the dividing lines of said adjacent one of the bonded bodies are spaced apart in a direction perpendicular to the parallel dividing lines by a distance of 20 mm or more in each dividing line.

10. The sputtering target assembly according to claim 1, wherein the dividing lines of one of the bonded bodies are parallel to the dividing lines of an adjacent one of the bonded bodies, and wherein the dividing lines of said one of the bonded bodies and the dividing lines of said adjacent one of the bonded bodies are spaced apart in a direction perpendicular to the parallel dividing lines by a distance of 50 mm or more.

11. The sputtering target assembly according to claim 1, wherein the dividing lines of one of the bonded bodies are parallel to the dividing lines of an adjacent one of the bonded bodies, and wherein the dividing lines of said one of the bonded bodies and the dividing lines of said adjacent one of the bonded bodies are spaced apart in a direction perpendicular to the parallel dividing lines by a distance of 100 mm or more.

12. The sputtering target assembly according to claim 1, wherein all of the target pieces of one of the bonded bodies are of the same length.

* * * * *

UNITED STATES PATENT AND TRADEMARK OFFICE
CERTIFICATE OF CORRECTION

PATENT NO. : 9,224,584 B2
APPLICATION NO. : 14/375239
DATED : December 29, 2015
INVENTOR(S) : Osada et al.

It is certified that error appears in the above-identified patent and that said Letters Patent is hereby corrected as shown below:

In the claims

Column 9, line 14, claim 9 "more in each dividing line." should read "more".

Signed and Sealed this
Nineteenth Day of July, 2016

Michelle K. Lee
*Director of the United States Patent and Trademark Office*